United States Patent [19]
Neth

[11] Patent Number: 5,105,145
[45] Date of Patent: Apr. 14, 1992

[54] VOLTAGE CONTROL CIRCUIT

[75] Inventor: Wolfram Neth, Mösingen, Fed. Rep. of Germany

[73] Assignee: Robert Bosch GmbH, Stuttgart, Fed. Rep. of Germany

[21] Appl. No.: 449,894

[22] PCT Filed: May 4, 1988

[86] PCT No.: PCT/EP88/00369
§ 371 Date: Dec. 4, 1989
§ 102(e) Date: Dec. 4, 1989

[87] PCT Pub. No.: WO89/11124
PCT Pub. Date: Nov. 16, 1989

[51] Int. Cl.[5] ............................. G05F 3/28; H03F 3/45
[52] U.S. Cl. .................................... 323/316; 323/280; 330/257; 330/261
[58] Field of Search ............... 323/268, 273, 280, 281, 323/313–316; 330/257, 261

[56] References Cited

U.S. PATENT DOCUMENTS 3,569,849  3/1971  Cassidy et al. ..................... 330/260
4,857,862  8/1989  Brokaw .............................. 323/281

Primary Examiner—Steven L. Stephan
Assistant Examiner—Emanuel Todd Voeltz
Attorney, Agent, or Firm—Michael J. Striker

[57] ABSTRACT

To stop high-voltage breakdown of a transistor (T1) in an amplifier circuit, a selectively conducting means, e.g. a diode (D), provides a low resistance path in response to a switching or control transistor (T8). Upon initiation of breakdown, the diode (D) conducts to block transistor (T1) and prevent damage thereto. The transistor (T1) is part of a multi-stage output amplifier (12) connected to an input differential amplifier (11). The output voltage is back to a transistor of the input amplifier (T7). The diode (D) may be replaced by a transistor (T, FIG. 2).

9 Claims, 1 Drawing Sheet

VOLTAGE CONTROL CIRCUIT

The present invention relates to a voltage control circuit, in particular a voltage control circuit for use with a high supply voltage.

BACKGROUND OF THE INVENTION

Without special protective measures, transistors can only be actively operated with collector-emitter voltages which lie below a value $U_{CEO}$ characteristic of the transistors (for example $U_{CEO}=20$ volts). In the blocked condition ($U_{BE}=0$), however, a higher voltage up to $U_{CES}$ can be applied to the transistor without damage thereto (for example $U_{CES}=40$ volts). Thus the value $U_{CES}$ is also a transistor characteristic.

The present invention seeks to provide a circuit, in particular a negative-feedback amplifier circuit or voltage controller, which can be actively operated with voltages above $U_{CEO}$ but below $U_{CES}$. The characteristic values or parameters $U_{CEO}$ and $U_{CES}$ are determined by the process of manufacture of the transistors as component parts of an integrated circuit. The present invention also seeks to provide a circuit suitable for use in motor vehicles or other applications in which the supply system is subject to high voltage peaks. The invention also seeks to provide an improved circuit suitable for construction by integrated circuit techniques.

SUMMARY OF THE INVENTION

According to the present invention there is provided a voltage control circuit comprising an amplifier with including at least one transistor having its collector-emitter path connected between a first reference potential $U_V$ and, via a resistive element, or a current source, a second reference potential C, characterised in that selectively conducting means is connected between said transistor and, via switching or controlling means (T8), said second reference potential G.

An advantage of this circuit is that it permits operation with a higher supply voltage than previously, i.e. a greater voltage difference between the two sources of reference potential $U_V$ and reference potential C, without the danger arising of a breakdown in the collector-emitter path of the transistor T1, followed by destruction of the transistor and failure of the circuit.

The circuit is particularly suitable for manufacture by integrated circuit techniques. The selectively conducting means, which preferably comprises a diode D or a transistor T, is conveniently fabricated in the same manufacturing process as the usual circuit components.

The selectively conducting means may be connected between the base of the amplifier transistor T1 and a potential which can become lower than the emitter-potential of T1. This has the advantage of quickly diverting the base current and thus blocking the transistor T1 to prevent damage thereto.

In a preferred arrangement the voltage control circuit comprises an input differential amplifier and an output multi-stage amplifier including transistors T1 and T2 wherein, the collector-emitter path of an additional transistor T8 in the multi-stage amplifier provides a convenient connection between the diode D or transistor T and ground potential or the reference potential (G). The use of a transistor T as the selectively conducting means is particularly advantageous in that it reduces the current loading of the additional transistor T8.

The circuit has the ability to fully block the transistors T1 and T2, but such full blocking is only transient. The control circuit operates in the same manner at high and low values of the supply voltage $U_V$, but in the case of a high $U_V$ value it can happen that base currents otherwise supplied to transistors T1 and T2 are dropped. The output voltage $U_A$ of the circuit remains substantially constant.

BRIEF DESCRIPTION OF THE DRAWINGS

Preferred embodiments of the present invention will now be described, by way of example only, with reference to the accompanying drawings, of which.

DETAILED DESCRIPTION OF THE PREFERRED EMBODIMENTS

Basically the present invention provides an arrangement in which, to stop high-voltage breakdown of a power transistor T1 in an amplifier circuit, a selectively conducting means, e.g. a diode D, provides a low resistance path to ground potential G; upon initiation of breakdown, the diode D conducts to block the transistor and prevent damage thereto.

Figure 1:
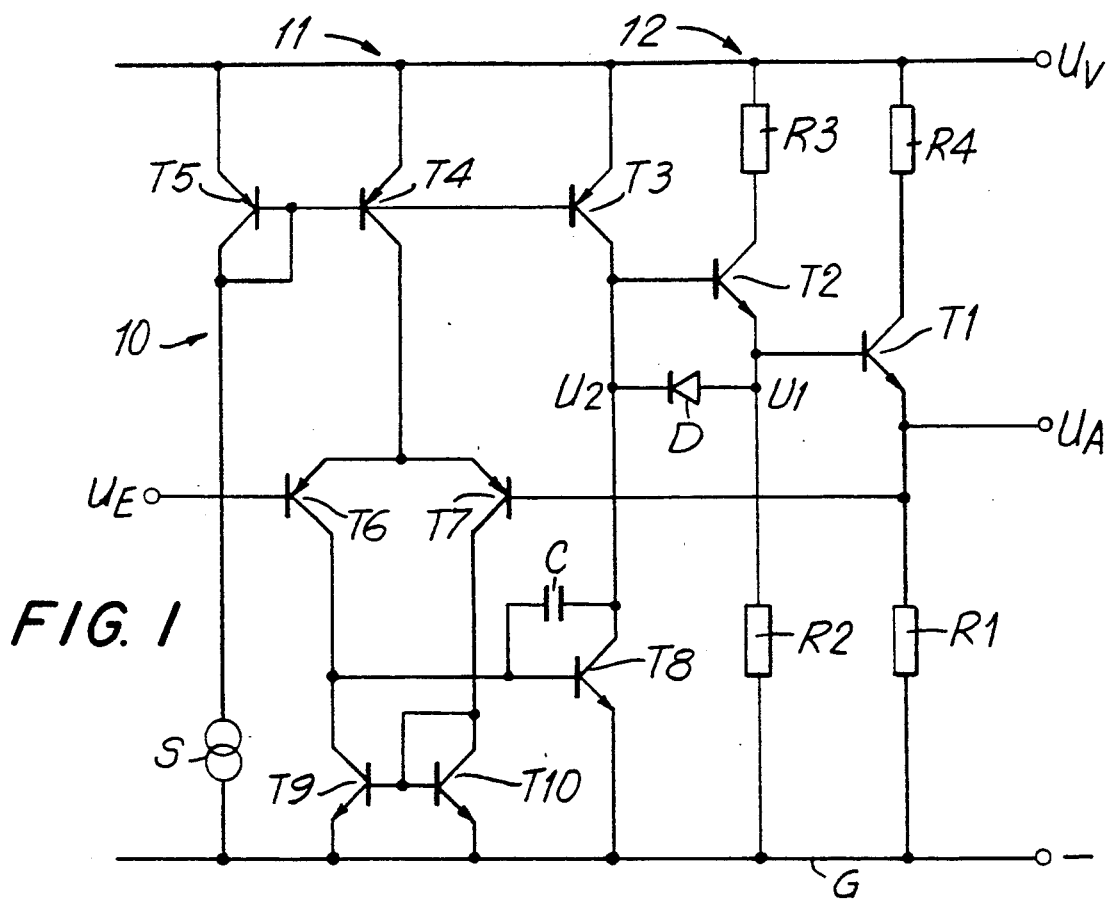
FIG. 1 is a circuit diagram of a voltage control circuit in accordance with a first embodiment of the present invention.

Referring to FIG. 1 there is shown a voltage control circuit 10 with an input voltage $U_E$ (e.g. from a bandgap reference source) and a controlled output voltage $U_A$. The circuit 10 comprises a differential amplifier 11 comprising transistors T6, T7, T9, T10, T4, T5, and current source S and a three-stage amplifier 12 comprising transistors T8, T3, T2 and T1. A capacitor C serves for frequency response compensation. Resistors R1 and R2 connected to ground potential G supply the bias currents for the transistors T1 and T2. Resistors R3 and R4 are relatively small current-limiting series resistors. The negative-feedback connection of the controlled output voltage $U_A$ to the base of transistor T7 constitutes a control loop, in which the voltage $U_A$ follows or tracks the input voltage $U_E$. An output terminal is connected directly to the emitter of transistor T1 and the output voltage ($U_A$) is drawn from its output terminal.

Connected between the bases of transistors T1 and T2 is a diode D, the voltages at the ends of which are designated U1 and U2. The diode D permits the supply voltage $U_V$ (e.g. 20 volts) to be considerably increased without damage to the circuit. This increased ability to withstand high voltages will now be explained.

A rise in the supply voltage $U_V$ leads eventually to an incipient collector-emitter (C-E) breakdown of transistor T1 so that output voltage $U_A$ also rises. However complete breakdown does not occur because the control circuit T6, T7, T9, T10, T8 lowers U2 in order to reduce $U_A$. This occurs because with $U_A$ raised and U2 lowered an incipient blocking of transistors T1 and T2 is produced. A complete or permanent blocking is not possible since this would lower $U_A$ to zero, and the control circuit would then raise U2 to activate transistors T1 and T2. As a result, the output voltage $U_A$ is controlled to just the right value, except for a transient deviation caused by the response time of the control circuit.

The transient or incipient blocking of transistor T1 is, however, only possible if the base current, which is reversed in polarity in the event of a breakdown, is ground. This cannot be effected sufficiently by the resistor R2, since resistor R2 has a relatively high resistance in order to obtain a high loop amplification. The negative base current of transistor T1 can be diverted, however, via the diode D and the control transistor T8, so that transistor T1 can be blocked. As soon as the value of U2 is lowered to the value of U1, transistor T2 is also blocked and therefore is no longer exposed to the danger of breakdown. Of course, the supply voltage $U_V$ must not rise above the transistor characteristic $U_{CES}$, because otherwise in an integrated circuit there is a possibility that PNP-transistors T3 and T4 will breakdown. Expressed mathematically, the above-described circuit permits operation in the otherwise unavailable range of $U_A < U_V < U_{CES}$.

If the C-E breakdown in transistor T2 starts first, U1 is raised by virtue of the then stronger drive of the transistor T2. Since U2 can be regarded as initially constant, transistor T2 is blocked and thus its ability to withstand high voltages is raised. Transistor T2 is protected because its base is fixed by the combination T3, T8 which controls the base current of transistor T2, and at incipient breakdown the emitter potential of transistor T2 rises and so blocks transistor T2. If transistor T2 is blocked, transistor T1 receives zero base-current, but blocking is only ensured when U2 is so low that diode D can conduct current. U2 is lowered by the control circuit when $U_A$ rises (e.g. as a result of incipient breakdown).

As a result of their construction, transistors T3 and T4, which are PNP transistors, are not likely to be subjected to breakdown in the voltage range concerned.

Figure 2:
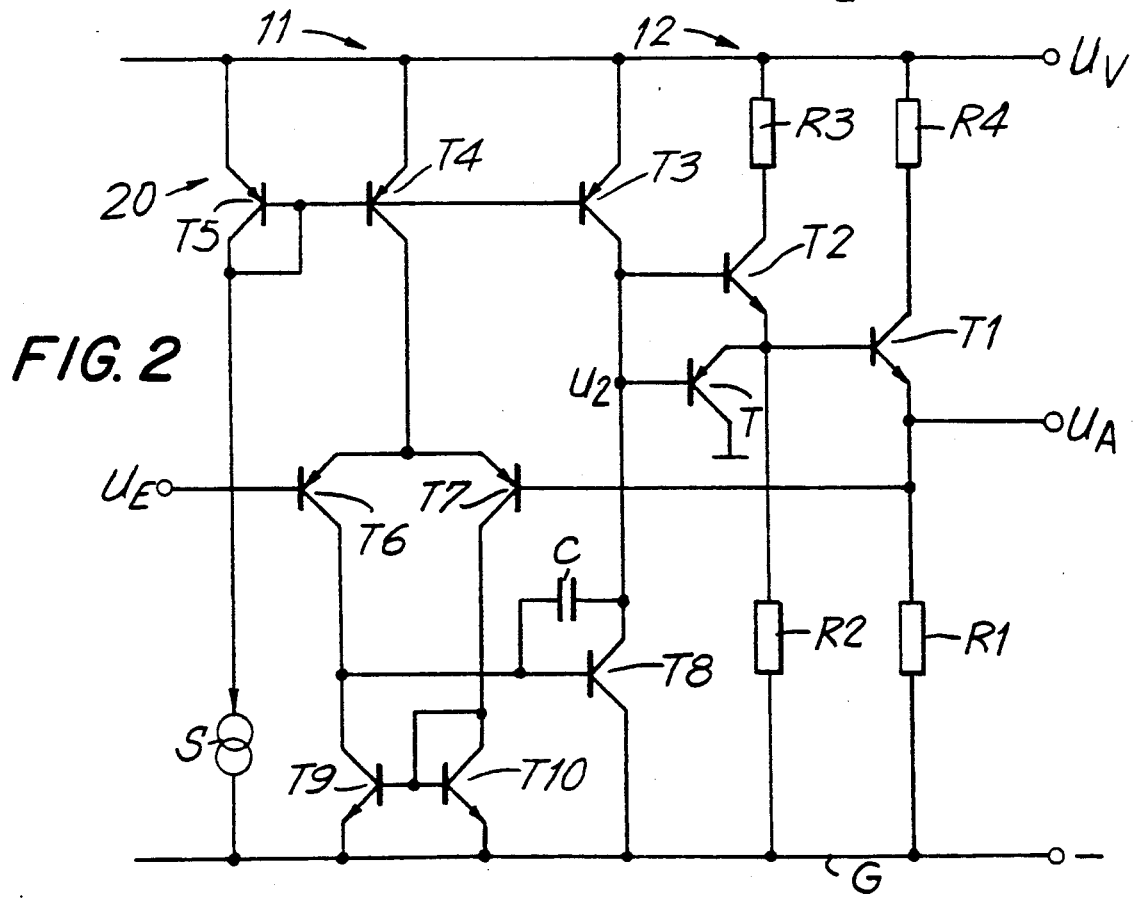
FIG. 2 is a circuit diagram of a voltage control circuit in accordance with a second embodiment of the present invention.

In a modification of the above-described arrangement, there is provided a voltage control circuit 20 in which the diode D is replaced by a transistor T, FIG. 2. This has the advantage that the current load of control transistor T8 is reduced.

With regards to the negative-feedback connection to transistor T7, this can be connected to an appropriate tap of resistor R1 if amplification of $U_E$ is desired ($U_A > U_E$). Typical values of $U_E$ and $U_A$ are 2.48 V and 3.7-5 V respectively. In a further modification, resistors R1 and R2 may be replaced by current sources. The above-described voltage control circuits are used together with a reference voltage source as an integrated power supply in integrated circuits. In the automotive field, such circuits may be used for control functions in a fuel-injection system or for monitoring functions in a system for triggering an air-bag in the event of a crash.

I claim:

1. A voltage control circuit (10, 20) including an amplifier, said amplifier comprising:
   a first transistor (T1) having a base, emitter and collector and a collector-emitter path, and the collector-emitter path of the first transistor being connected between a first reference potential ($U_V$) and, via a resistive element (R1), a second reference potential (G);
   a second transistor (T2) having a base, a collector, an emitter and a collector-emitter path;
   a selectively conducting circuit means (D, T) responsive to a controlling circuit means (T8) for providing conduction between said first transistor (T1) and said second reference potential (G), and said selective conducting circuit means (D, T) having two terminals,
   an output terminal connected to the emitter of the first transistor (T1) form which the output voltage ($U_A$) is drawn; and
   wherein one of the terminals of the selectively conducting circuit means (D, T) is connected to the base of said first transistor (T1) and to the collector-emitter path of said second transistor (T2), and the other terminal of said selectively conducting circuit means is connected to said second reference potential (G).

2. A voltage control circuit according to claim 1, wherein the selectively conducting means (D, T) is connected between the reference potential (G) and the base of said first transistor (T1).

3. A voltage control circuit according to claim 1, wherein said controlling circuit means comprises a control transistor (T8).

4. A voltage control circuit according to claim 3, further comprising another amplifier acting as an input amplifier connected to said amplifier, said amplifier acting as an output amplifier, said other amplifier having a transistor (T7) having a base, an emitter and a collector, wherein said first and second transistors (T1, T2) and said switching or controlling circuit means (T8) are parts of said output amplifier.

5. A voltage control circuit according to claim 4, wherein the input amplifier is a differential amplifier (T6, T7, T9, T10, T4, T5, S) and the output amplifier is a multi-stage amplifier (T8, T3, T2, T1).

6. A voltage control circuit according to claim 5, wherein a negative feedback connection is provided between the output terminal of the output amplifier and the transistor (T7) of the input amplifier.

7. A voltage control circuit according to claim 6, wherein the resistor (R1) is connected to the output terminal of the output amplifier and the base of the transistor (T7) in the input amplifier.

8. A voltage control circuit according to claim 1, wherein the selectively conducting circuit means is a diode (D).

9. A voltage control circuit according to claim 1, wherein the selectively conducting circuit means is a transistor (T).

* * * * *